(12) United States Patent
Huang et al.

(10) Patent No.: US 8,288,189 B2
(45) Date of Patent: Oct. 16, 2012

(54) PACKAGE STRUCTURE HAVING MEMS ELEMENT AND FABRICATION METHOD THEREOF

(75) Inventors: Chun-An Huang, Taichung (TW);
Hsin-Yi Liao, Taichung (TW);
Shih-Kuang Chiu, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 190 days.

(21) Appl. No.: 12/906,401

(22) Filed: Oct. 18, 2010

(65) Prior Publication Data
US 2012/0056279 A1 Mar. 8, 2012

(30) Foreign Application Priority Data
Sep. 7, 2010 (TW) ................. 99130155 A

(51) Int. Cl.
*H01L 21/00* (2006.01)
*H01L 29/84* (2006.01)
(52) U.S. Cl. ...... 438/50; 438/51; 257/415; 257/E21.499; 257/E29.324
(58) Field of Classification Search .............. 257/415, 257/E29.324; 438/50, 51, 52
See application file for complete search history.

(56) References Cited

U.S. PATENT DOCUMENTS

| | | | | |
|---|---|---|---|---|
| 7,608,470 | B2 * | 10/2009 | Talalaevski et al. | 438/22 |
| 7,993,944 | B2 * | 8/2011 | Oliver et al. | 438/26 |
| 2011/0241197 | A1 * | 10/2011 | Theuss | 257/693 |

* cited by examiner

*Primary Examiner* — Michelle Mandala
*Assistant Examiner* — Shaka White
(74) *Attorney, Agent, or Firm* — Peter F. Corless; Steven M. Jensen; Edwards Wildman Palmer LLP

(57) ABSTRACT

A package structure having an MEMS element includes: a packaging substrate having first and second wiring layers on two surfaces thereof and a chip embedded therein; a first dielectric layer disposed on the packaging substrate and the chip; a third wiring layer disposed on the first dielectric layer; a second dielectric layer disposed on the first dielectric layer and the third wiring layer and having a recessed portion; a lid disposed in the recessed portion and on the top surface of the second dielectric layer around the periphery of the recessed portion, wherein the portion of the lid on the top surface of the second dielectric layer is formed into a lid frame on which an adhering material is disposed to allow a substrate having an MEMS element to be attached to the packaging substrate with the MEMS element corresponding in position to the recessed portion, thereby providing a package structure of reduced size and costs with better electrical properties.

19 Claims, 3 Drawing Sheets

US 8,288,189 B2

PACKAGE STRUCTURE HAVING MEMS ELEMENT AND FABRICATION METHOD THEREOF

CROSS-REFERENCES TO RELATED APPLICATIONS

This application claims under 35 U.S.C. §119(a) the benefit of Taiwanese Application No. 099130155 filed Sep. 7, 2010, the entire contents of which is incorporated herein by reference.

BACKGROUND OF THE INVENTION

1. Field of the Invention

The present invention relates to package structures and fabrication methods thereof, and more particularly, to a package structure having a Micro Electro Mechanical System (MEMS) element and a fabrication method thereof.

2. Description of Related Art

Micro Electro Mechanical System (MEMS) techniques integrate electrical and mechanical functions into a single element using micro-fabrication technology. An MEMS element is disposed on a chip and covered by a shield or packaged with an underfill adhesive so as to protect the MEMS element from the external environment.

FIG. 1 is a cross-sectional view of a conventional package structure having an MEMS element. Referring to FIG. 1, the package structure comprises a quad flat no lead (QFN) type lead frame 10; a chip 11 disposed on the lead frame 10; an MEMS element 12 disposed on the chip 11; a lid 13 disposed on the chip 11 to cover the chip 11; an aluminum layer 14 disposed on the top surface of the lid 13; a plurality of bonding wires 15 electrically connecting the chip 11 and the aluminum layer 14 to the lead frame 10, respectively; and an encapsulant 16 encapsulating the lead frame 10, the chip 11, the lid 13, the aluminum layer 14 and the bonding wires 15.

However, due to the use of the lead frame 10 and the lid 13, the package structure becomes too thick.

Further, using the bonding wires made of gold for electrically connecting the MEMS element and the lead frame easily results in slow signal transmission and low sensitivity. Also, gold wires incur high fabrication costs. Furthermore, the encapsulant encapsulating the MEMS element and the gold wires leads to increase of the thickness of the overall package structure. Therefore, such a package structure does not meet the trend of miniaturization and low cost.

Therefore, it is imperative to provide a package structure having an MEMS element that has reduced size, low cost and improved signal transmission efficiency.

SUMMARY OF THE INVENTION

In view of the above drawbacks of the prior art, the present invention provides a package structure having an MEMS element, which comprises: a packaging substrate with a first surface having a first wiring layer disposed thereon and a second surface opposite to the first surface and having a second wiring layer disposed thereon, a plurality of conductive through holes penetrating the packaging substrate for electrically connecting the first wiring layer and the second wiring layer; a chip embedded in the packaging substrate and having a plurality of electrode pads exposed from the first surface of the packaging substrate; a first dielectric layer disposed on the first surface of the packaging substrate and the chip and having a plurality of openings for exposing a portion of the first wiring layer and the electrode pads of the chip; a third wiring layer disposed on the first dielectric layer and electrically connected to the first wiring layer and the electrode pads; a second dielectric layer disposed on the first dielectric layer and the third wiring layer and having a recessed portion and a plurality of blind vias penetrating the first and second dielectric layers; a lid disposed in the recessed portion and on the top surface of the second dielectric layer around the periphery of the recessed portion, wherein the portion of the lid on the top surface of the second dielectric layer is formed into a lid frame; a plurality of first conductive pads disposed on the second dielectric layer; a plurality of second conductive vias formed in the blind vias penetrating the first and second dielectric layers so as to electrically connect the first wiring layer and the first conductive pads; an adhering material disposed on the first conductive pads and the lid frame; and a substrate having an MEMS element and a plurality of second conductive pads disposed on a surface thereof and attached to the packaging substrate with the MEMS element corresponding in position to the recessed portion.

The present invention further discloses a fabrication method of a package structure having an MEMS element, which comprises: preparing a packaging substrate having a first surface and an opposite second surface with a first wiring layer and a second wiring layer formed thereon, respectively, a plurality of conductive through holes penetrating the packaging substrate for electrically connecting the first wiring layer and the second wiring layer, and at least a chip being embedded in the packaging substrate and having a plurality of electrode pads exposed from the first surface of the packaging substrate; sequentially forming on the first surface of the packaging substrate and the chip a first dielectric layer and a third wiring layer electrically connected to the electrode pads and the first wiring layer; forming a second dielectric layer on the first dielectric layer and the third wiring layer; removing a portion of the second dielectric layer so as to form a recessed portion and a plurality of blind vias penetrating the first and second dielectric layers; forming a lid in the recessed portion and on the top surface of the second dielectric layer around the periphery of the recessed portion, wherein the portion of the lid on the top surface of the second dielectric layer is formed into a lid frame, and forming a plurality of first conductive pads on the second dielectric layer, and forming a plurality of second conductive vias in the blind vias penetrating the first and second dielectric layers for electrically connecting the first wiring layer and the first conductive pads; forming an adhering material on the first conductive pads and the lid frame; and attaching a substrate having at least an MEMS element and a plurality of second conductive pads disposed on a surface thereof, to the packaging substrate with the MEMS element corresponding in position to the recessed portion.

According to the present invention, the chip is directly embedded in the packaging substrate so as to reduce the thickness and volume of the overall structure. Further, since the chip, the MEMS element and the packaging substrate are electrically connected through embedded traces, the present invention improves the signal transmission efficiency and reduces the fabrication cost as compared to the wire bonding method of the prior art. In addition, the lid can be formed while forming the first conductive pads and the second conductive vias so as to simplify the fabrication process. Furthermore, as compared with the conventional QFN type lead frame, array-arranged solder balls of the present invention provide more I/O connections, thus expanding the application range of the present invention.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that the drawings are only for illustrative purposes and not intended to limit the present invention. Meanwhile, terms such as 'up', 'down', 'a' etc. are only used as a matter of descriptive convenience and not intended to have any other significance or provide limitations for the present invention.

FIGS. 2A to 2E are cross-sectional views showing a package structure having an MEMS element and a fabrication method thereof according to the present invention.

Figure 1:
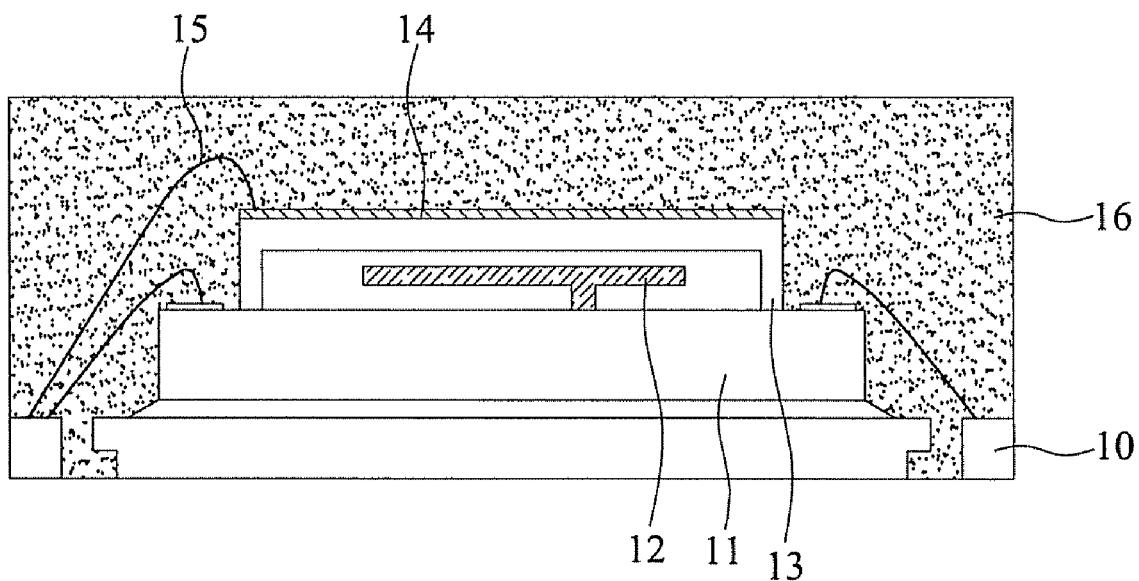
FIG. 1 is a cross-sectional view showing a conventional package structure having an MEMS element.
Figure 2A:
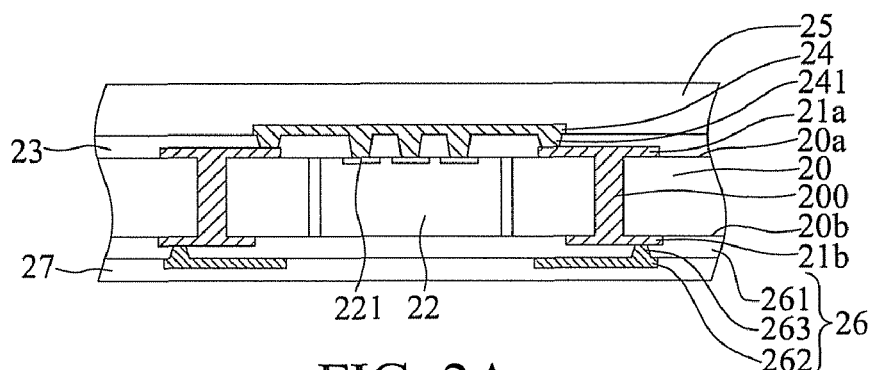
FIGS. 2A to 2E are cross-sectional views showing a package structure having an MEMS element and a fabrication method thereof according to the present invention, wherein FIG. 2C' shows a package structure with a first solder mask layer formed thereon.

Referring to FIG. 2A, a packaging substrate 20 having a first surface 20a and an opposite second surface 20b is prepared, wherein a first wiring layer 21a and a second wiring layer 21b are formed on the first surface 20a and the second surface 20b, respectively, and electrically connected to each other through a plurality of conductive through holes 200 penetrating the packaging substrate 20, and at least a chip 22 is embedded in the packaging substrate 20 and has a plurality of electrode pads 221 exposed from the first surface 20a of the packaging substrate 20. The chip 22 can be such as an application specific integrated circuit (ASIC) chip. Then, a first dielectric layer 23 is formed on the first surface 20a of the packaging substrate 20 and the chip 22, and a third wiring layer 24 is formed on the first dielectric layer 23, wherein a plurality of first conductive vias 241 is formed in the first dielectric layer 23 by laser for electrically connecting to the electrode pads 221 and the first wiring layer 21a. Thereafter, a second dielectric layer 25 is formed on the first dielectric layer 23 and the third wiring layer 24. The second dielectric layer 25 can be made of a solder resist material or a photo-sensitive dielectric material. Further, the packaging substrate 20 can be provided with a built-up structure 26 disposed on the second surface thereof. Alternatively, the built-up structure 26 can be formed on the second surface of the packaging substrate 20 during the fabrication process. The built-up structure 26 has at least a fourth dielectric layer 261, a fourth wiring layer 262 formed on the fourth dielectric layer 261, and a plurality of third conductive vias 263 formed in the fourth dielectric layer 261 for electrically connecting the fourth wiring layer 262 and the second wiring layer 21b. A second solder mask layer 27 can further be formed on the built-up structure 26.

Figure 2B:
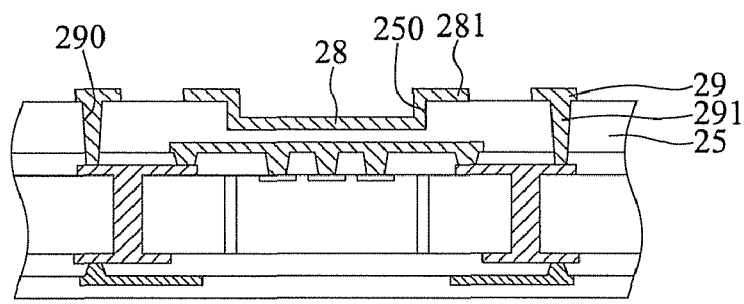

Referring to FIG. 2B, through a photo-lithography process or a laser process, a portion of the second dielectric layer 25 is removed so as to form a recessed portion 250 and a plurality of blind vias 290 penetrating the first dielectric layer 23 and the second dielectric layer 25. Thereafter, a lid 28 is formed in the recessed portion 250 and on the top surface of the second dielectric layer 25 around the periphery of the recessed portion 250, wherein the portion of the lid 28 on the top surface of the second dielectric layer 25 constitutes is formed into a lid frame 281, and the lid 28 may be made of metal, silicon, glass or ceramic. Further, a plurality of first conductive pads 29 is formed on the second dielectric layer 25 by electroplating or deposition and a plurality of second conductive vias 291 is formed in the blind vias 290 for electrically connecting the first wiring layer 21a and the first conductive pads 29.

Figure 2C:
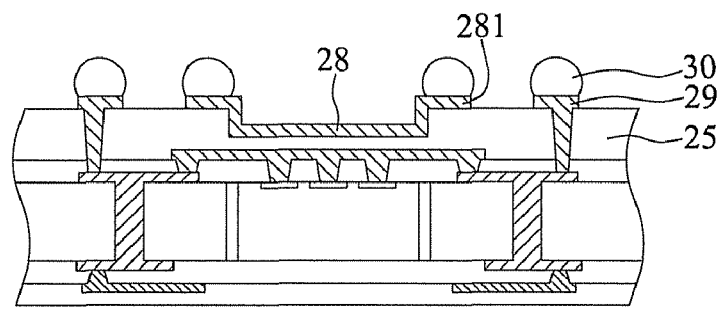
Figure 2C:
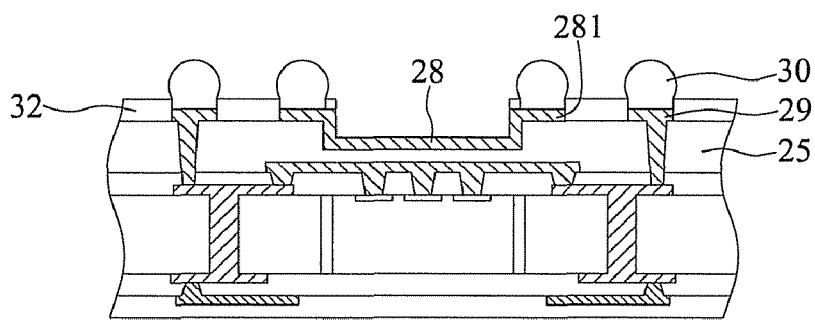

Referring to FIG. 2C, an adhering material 30 is formed on the first conductive pads 29 and the lid frame 281. The adhering material 30 can be solder bumps mounted on the first conductive pads 29 and ring-shaped solder bumps, solder paste or glass adhesive mounted on the lid frame 281.

Alternatively, referring to FIG. 2C', before the adhering material 30 is formed, a first solder mask layer 32 is formed on the second dielectric layer 25 and the first conductive pads 29 and a plurality of openings is formed in the solder mask layer 32 for exposing the first conductive pads 29, respectively, and the adhering material 30 is formed in the openings of the first solder mask layer 32. The first solder mask layer 32 can be made of a solder resistant material or a photo-sensitive dielectric material.

Figure 2D:
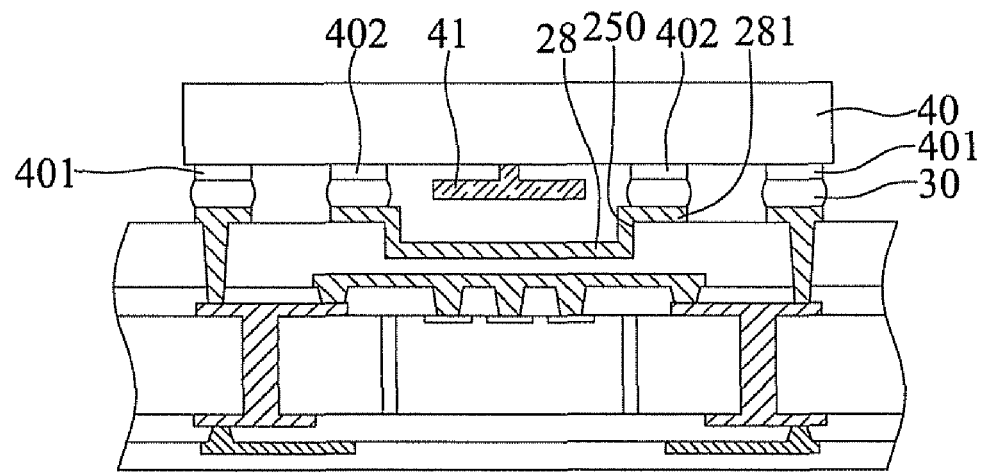

Referring to FIG. 2D, a substrate 40 having at least an MEMS element 41 and a plurality of second conductive pads 401 disposed on a surface thereof is provided, wherein the substrate 40 can be made of a silicon material. The second conductive pads 401 are electrically connected to the first conductive pads 29 through the adhering material 30, respectively. Further, the surface of the substrate 40 with the MEMS element 41 disposed thereon has a metal frame 402 disposed around the periphery of the MEMS element 41. The substrate 40 is attached to the packaging substrate 20 through the adhering material 30 with the MEMS element 41 corresponding in position to the recessed portion 250. That is, the metal frame 402 is adhered to the lid frame 281 through the adhering material 30 so as to seal the MEMS element 41 inside the package structure. The MEMS element 41 can be a gyroscope, an accelerometer or an RF MEMS element.

Figure 2E:
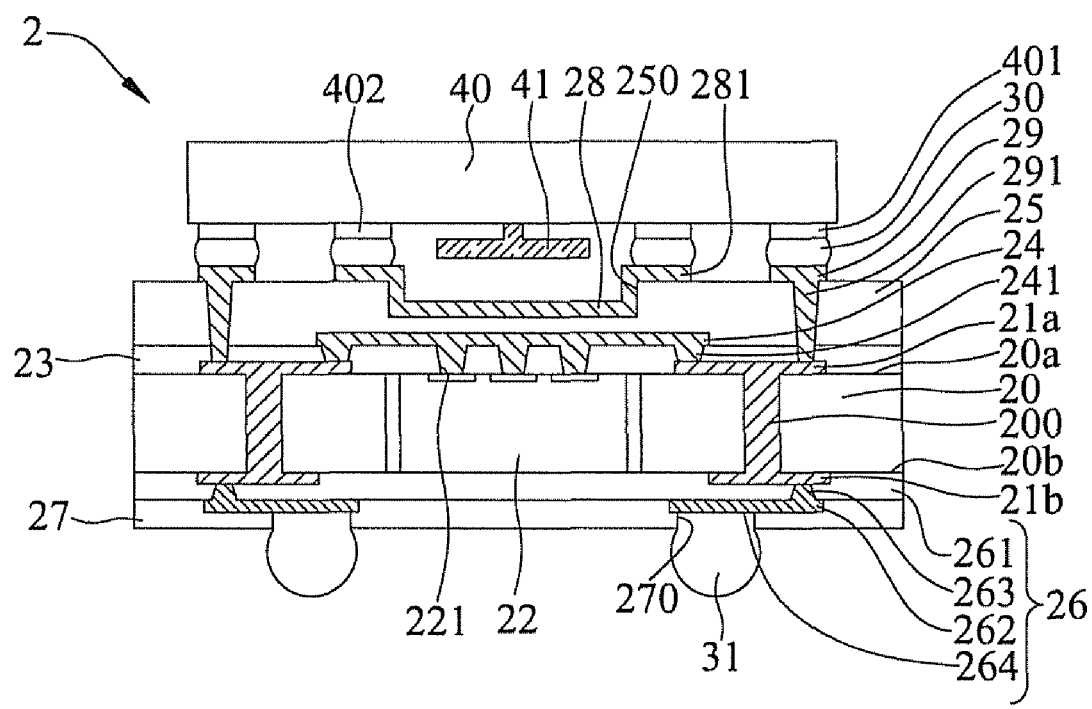

Referring to FIG. 2E, the outermost fourth wiring layer 262 of the built-up structure 26 has a plurality of solder ball pads 264, and the second solder mask layer 27 has a plurality of openings 270 formed therein for exposing the solder ball pads 264, respectively, so as for a plurality of solder balls 31 to be implanted thereon. Afterwards, a singulation process can be performed to obtain a plurality of package structures 2 having an MEMS element.

The present invention further provides a package structure 2 having an MEMS element, which has: a packaging substrate having a first surface 20a with a first wiring layer 21a disposed thereon and a second surface 20b opposite to the first surface 20a and having a second wiring layer 21b disposed thereon, a plurality of conductive through holes 200 penetrating the packaging substrate 20 for electrically connecting the first wiring layer 21a and the second wiring layer 21b; a chip 22 embedded in the packaging substrate 20 and having a plurality of electrode pads 221 exposed from the first surface 20a of the packaging substrate 20; a first dielectric layer 23 disposed on the first surface 20a of the packaging substrate and the chip 22 and having a plurality of openings for exposing a portion of the first wiring layer 21a and the electrode pads 221; a third wiring layer 24 disposed on the first dielectric layer 23 and electrically connected to the first wiring layer 21a and the electrode pads 221; a second dielectric layer 25 disposed on the first dielectric layer 23 and the third wiring layer 24 and having a recessed portion 250 and a plurality of blind vias 290 penetrating the first dielectric layer 23 and the second dielectric layer 25; a lid 28 disposed in the recessed portion 250 and on the top surface of the second dielectric layer 25 around the periphery of the recessed portion 250, wherein the portion of the lid 28 on the top surface of the second dielectric layer 25 is formed into a lid frame 281; a plurality of first conductive pads 29 disposed on the second dielectric layer 25; a plurality of second conductive vias 291 disposed in the blind vias 290 for electrically connecting the first wiring layer 21a and the first conductive pads 29; an adhering material 30 formed on the first conductive pads 29 and the lid frame 281; and a substrate 40 having an MEMS element 41 and a plurality of second conductive pads 401 disposed thereon and attached to the packaging substrate 20 with the MEMS element 41 corresponding in position to the recessed portion 250.

In the above-described package structure 2, the surface of the substrate 40 with the MEMS element 41 disposed thereon further comprises a metal frame 402 disposed around the periphery of the MEMS element 41. The metal frame 402 is attached to the lid frame 281 through the attach material 30. The package structure 2 can further comprise a first solder mask layer 32 (referring to FIG. 2C') disposed on the second dielectric layer 25 and the first conductive pads 29 and having a plurality of openings for exposing the first conductive pads 29, respectively, wherein the first solder mask layer 32 can be made of a solder resistant material or a photo-sensitive dielectric material, and the attach material is disposed in the openings of the first solder mask layer 32.

The package structure can further comprise a built-up structure 26 disposed on the second surface 20b of the packaging substrate 20. The built-up structure 26 has at least a fourth dielectric layer 261, a fourth wiring layer 262 disposed on the fourth dielectric layer 261 and a plurality of third conductive vias 263 disposed in the fourth dielectric layer 261 for electrically connecting the fourth wiring layer 262 and the second wiring layer 21b. Further, the outermost fourth wiring layer 262 of the built-up structure 26 has a plurality of solder ball pads 264.

The package structure can further comprise a second solder mask layer 27 disposed on the built-up structure 26 and having a plurality of openings 270 for exposing the solder ball pads 264, respectively; and a plurality of solder balls 31 disposed on the solder ball pads 264, respectively.

In the above-described package structure, the chip 22 can be an ASIC chip. The second dielectric layer 25 can be made of a solder resistant material or a photo-sensitive dielectric material. The lid 28 can be made of metal, silicon, glass or ceramic. The MEMS element 41 can be a gyroscope, an accelerometer or an RF MEMS element.

According to the present invention, the chip is directly embedded in the packaging substrate so as to reduce the thickness and volume of the overall structure. Further, since the chip, the MEMS element and the packaging substrate are electrically connected through embedded traces, the present invention improves the signal transmission efficiency and reduces the fabrication cost as compared to the wire bonding method of the prior art. In addition, the lid can be formed while forming the first conductive pads and the second conductive vias so as to simplify the fabrication process. Furthermore, as compared with the conventional QFN type lead frame, array-arranged solder balls of the present invention provide more I/O connections, thus expanding the application range of the present invention.

The above-described descriptions of the detailed embodiments are intended to illustrate the preferred implementation according to the present invention but are not intended to limit the scope of the present invention. Accordingly, all modifications and variations completed by those with ordinary skill in the art should fall within the scope of present invention defined by the appended claims.

What is claimed is:

1. A package structure having a Micro Electro Mechanical System (MEMS) element, comprising:
    a packaging substrate with a first surface having a first wiring layer disposed thereon and a second surface opposite to the first surface and having a second wiring layer disposed thereon, a plurality of conductive through holes penetrating the packaging substrate for electrically connecting the first wiring layer and the second wiring layer;
    a chip embedded in the packaging substrate and having a plurality of electrode pads exposed from the first surface of the packaging substrate;
    a first dielectric layer disposed on the first surface of the packaging substrate and the chip and having a plurality of openings for exposing a portion of the first wiring layer and the electrode pads of the chip;
    a third wiring layer disposed on the first dielectric layer and electrically connected to the first wiring layer and the electrode pads;
    a second dielectric layer disposed on the first dielectric layer and the third wiring layer and having a recessed portion and a plurality of blind vias penetrating the first and second dielectric layers;
    a lid disposed in the recessed portion and on a top surface of the second dielectric layer around a periphery of the recessed portion, wherein a portion of the lid on the top surface of the second dielectric layer is formed into a lid frame;
    a plurality of first conductive pads disposed on the second dielectric layer;
    a plurality of second conductive vias disposed in the blind vias penetrating the first and second dielectric layers so as to electrically connect the first wiring layer and the first conductive pads;
    an adhering material disposed on the first conductive pads and the lid frame; and
    a substrate having an MEMS element and a plurality of second conductive pads disposed on a surface thereof and attached to the packaging substrate with the MEMS element corresponding in position to the recessed portion.

2. The structure of claim 1, wherein the surface of the substrate with the MEMS element disposed thereon further comprises a metal frame attached to the lid frame through the adhering material.

3. The structure of claim 1, further comprising a first solder mask layer disposed on the second dielectric layer and the first conductive pads and having a plurality of openings for exposing the first conductive pads, respectively, allowing the adhering material being disposed in the openings of the first solder mask layer.

4. The structure of claim 1, further comprising a built-up structure disposed on the second surface of the packaging substrate, wherein the built-up structure comprises at least a fourth dielectric layer, a fourth wiring layer disposed on the fourth dielectric layer and a plurality of third conductive vias formed in the fourth dielectric layer for electrically connecting the fourth wiring layer and the second wiring layer, and an outermost fourth wiring layer has a plurality of solder ball pads.

5. The structure of claim 4, further comprising a second solder mask layer disposed on the built-up structure and having a plurality openings for exposing the solder ball pads, respectively.

6. The structure of claim 5, further comprising a plurality of solder balls implanted on the solder ball pads, respectively.

7. The structure of claim 1, wherein the second dielectric layer is made of a solder resistant material or a photo-sensitive dielectric material.

8. The structure of claim 3, wherein the first solder mask layer is made of a solder resistant material or a photo-sensitive dielectric material.

9. The structure of claim 1, wherein the packaging substrate is made of a silicon material.

10. A fabrication method of a package structure having an MEMS element, comprising:

preparing a packaging substrate having a first surface with a first wiring layer formed thereon and an opposite second surface with a second wiring layer formed thereon, a plurality of conductive through holes penetrating the packaging substrate for electrically connecting the first wiring layer and the second wiring layer, and at least a chip being embedded in the packaging substrate and having a plurality of electrode pads exposed from the first surface of the packaging substrate;

sequentially forming on the first surface of the packaging substrate and the chip a first dielectric layer and a third wiring layer electrically connected to the electrode pads and the first wiring layer;

forming a second dielectric layer on the first dielectric layer and the third wiring layer;

removing a portion of the second dielectric layer so as to form a recessed portion and a plurality of blind vias penetrating the first and second dielectric layers;

forming a lid in the recessed portion and on a top surface of the second dielectric layer around a periphery of the recessed portion, wherein a portion of the lid on the top surface of the second dielectric layer is formed into a lid frame, and forming a plurality of first conductive pads on the second dielectric layer, and them forming a plurality of second conductive vias in the blind vias penetrating the first and second dielectric layers for electrically connecting the first wiring layer and the first conductive pads;

forming an adhering material on the first conductive pads and the lid frame; and attaching a substrate having at least an MEMS element and a plurality of second conductive pads disposed on a surface thereof to the packaging substrate with the MEMS element corresponding in position to the recessed portion.

11. The method of claim 10, wherein the surface of the substrate with the MEMS element disposed thereon further comprises a metal frame attached to the lid frame through the adhering material.

12. The method of claim 10, before forming the adhering material, further comprising forming a first solder mask layer on the second dielectric layer and the first conductive pads and forming a plurality of openings in the first solder mask layer for exposing the first conductive pads, respectively, allowing the adhering material to be formed in the openings of the first solder mask layer.

13. The method of claim 10, further comprising forming a built-up structure on the second surface of the packaging substrate, wherein the built-up structure comprises at least a fourth dielectric layer, a fourth wiring layer formed on the fourth dielectric layer and a plurality of third conductive vias formed in the fourth dielectric layer for electrically connecting the fourth wiring layer and the second wiring layer, wherein an outermost fourth wiring layer has a plurality of solder ball pads.

14. The method of claim 13, further comprising forming a second solder mask layer disposed on the built-up structure and forming a plurality of openings in the second solder mask layer for exposing the solder ball pads, respectively.

15. The method of claim 14, further comprising implanting a plurality of solder balls on the solder ball pads, respectively.

16. The method of claim 15, further comprising performing a singulation process to obtain a plurality of package structures having an MEMS element.

17. The method of claim 10, wherein the second dielectric layer is made of a solder resistant material or a photo-sensitive dielectric material.

18. The method of claim 12, wherein the first solder mask layer is made of a solder resistant material or a photo-sensitive dielectric material.

19. The method of claim 10, wherein the packaging substrate is made of a silicon material.

* * * * *